(12) United States Patent
Hsu et al.

(10) Patent No.: US 7,837,902 B2
(45) Date of Patent: Nov. 23, 2010

(54) COMPOSITIONS OF ELECTRICALLY CONDUCTIVE POLYMERS AND NON-POLYMERIC FLUORINATED ORGANIC ACIDS

(75) Inventors: Che-Hsiung Hsu, Wilmington, DE (US);
Mark Andrew Harmer, Kennett Square, PA (US); Christopher P. Junk, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/972,784

(22) Filed: Jan. 11, 2008

(65) Prior Publication Data

US 2008/0105867 A1 May 8, 2008

Related U.S. Application Data

(62) Division of application No. 10/823,320, filed on Apr. 13, 2004, now Pat. No. 7,354,532.

(51) Int. Cl.
*H01B 1/00* (2006.01)
*C08G 75/00* (2006.01)
*C08G 73/06* (2006.01)

(52) U.S. Cl. .................. 252/500; 528/377; 528/423

(58) Field of Classification Search .............. 252/500; 528/377, 423
See application file for complete search history.

(56) References Cited

U.S. PATENT DOCUMENTS

| | | | |
|---|---|---|---|
| 5,002,700 A | 3/1991 | Otagawa et al. | 252/500 |
| 5,066,731 A | 11/1991 | Feldhues et al. | 525/417 |
| 5,126,017 A | 6/1992 | Nakama et al. | 205/159 |
| 5,185,100 A | 2/1993 | Han et al. | 252/500 |
| 5,233,000 A | 8/1993 | Yodice | 526/268 |
| 5,281,363 A | 1/1994 | Shacklette et al. | 252/500 |
| 5,300,575 A | 4/1994 | Jonas et al. | 525/186 |
| 5,932,144 A | 8/1999 | Shimizu et al. | 252/500 |
| 6,030,550 A | 2/2000 | Angelopoulos et al. | 252/500 |
| 6,967,236 B1 | 11/2005 | Angelopoulous et al. | 528/491 |

(Continued)

FOREIGN PATENT DOCUMENTS

EP 1 384 739 A1 1/2004

(Continued)

OTHER PUBLICATIONS

Wenbiao Chen et al., 1,1,2,2-Tetrafluoro-2-(polyfluoroalkoxy)ethanesulfonic Acids, 1,1,2,2-Tetrafluoro-2-(perfluoroalkoxy)ethane-sulfonic Acids, and 2,2'-Oxybis(1,1,2,2-tetrafluoroethanesulfonic acid), Inorg. Chem., 1988, vol. 27, pp. 1376-1377, American Chemical Society.

(Continued)

*Primary Examiner*—Mark Kopec
*Assistant Examiner*—Jaison P Thomas
(74) *Attorney, Agent, or Firm*—John H. Lamming

(57) ABSTRACT

Compositions are provided comprising at least one conductive polymer and at least one non-polymeric fluorinated organic acid, salt or ester, wherein the conductive polymer is selected from a polythiophene, a polypyrrole, a polyaniline, and combinations thereof. Electronic devices and applications having at least one layer comprising such compositions are further provided.

20 Claims, 1 Drawing Sheet

U.S. PATENT DOCUMENTS

2006/0202171 A1    9/2006   Yoshida et al. ............... 252/500

FOREIGN PATENT DOCUMENTS

| JP | 62 119237 A | | 5/1987 |
|---|---|---|---|
| JP | S62-119237 | * | 5/1987 |
| JP | 2003-040856 | | 2/2003 |
| WO | WO 93/05519 A1 | | 3/1993 |
| WO | WO 02/065484 A1 | | 8/2002 |
| WO | WO 2004/019345 A1 | | 3/2004 |

OTHER PUBLICATIONS

Kaoru Iwata et al., Chemical Abstracts Service, Dopants for Electrically conductive polymers, Jan. 9, 1988, XP002335513, American Chemical Society.

C-H. Hsu, Novel Preparation and Properties of Conductive Polyaniline/Nafion® Film, Synthetic Metals, 1991, [41-43], pp. 671-674, Elsevier Sequoia, The Netherlands.

S.A. Arnautov et al., New Dopant-Solvent System for Conductive Pan Films Production, Synthetic Metals, 1997, vol. 84, No. 1-3, pp. 133-134, Elsevier Science S.A.

Written Opinion of the International Searching Authority, European Patent Office, D-80298 Munich, Germany, C. Meiners, Authorized Officer, Oct. 13, 2006, PCT/US2005/012461, PCT counterpart of the present application.

Official Letter, Application No. 05 736 268.3-2102, European Patent Office, D-80298 Munich, Germany, C. Meiners, Authorized Officer, Nov. 11, 2008, European regional counterpart of the present application.

* cited by examiner

COMPOSITIONS OF ELECTRICALLY CONDUCTIVE POLYMERS AND NON-POLYMERIC FLUORINATED ORGANIC ACIDS

RELATED APPLICATION DATA

This application is a division of application Ser. No. 10/823,320 filed Apr. 13, 2004.

FIELD OF THE INVENTION

The invention relates to compositions comprising at least one electrically conducting polymer and at least one non-polymeric fluorinated organic acid.

BACKGROUND OF THE INVENTION

Electrically conducting polymers have been used in a variety of organic electronic devices, including in the development of electroluminescent ("EL") devices for use in light emissive displays. With respect to EL devices, such as organic light emitting diodes (OLEDs) containing conducting polymers, such devices generally have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent dyes, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. The buffer layer can also be called a hole-injection layer, a hole transport layer, or may be characterized as part of a bilayer anode. Typical conducting polymers employed as buffer layers include polyaniline ("PAni") and polydioxythiophenes such as poly(3,4-ethylenedioxythiophene) ("PEDT"). These materials can be prepared by polymerizing aniline or dioxythiophene monomers in aqueous solution in the presence of a water soluble polymeric acid, such as poly(styrenesulfonic acid) ("PSSA"), or poly(2-acrylamido-2-methyl-1-propanesulfonic acid) ("PAAMPSA"), as described in, for example, U.S. Pat. No. 5,300,575 and published PCT application WO 02/065484. A well known PEDT/PSS material is Baytron®-P, commercially available from H. C. Starck, GmbH (Leverkusen, Germany).

There is a need for improved conductive polymers with good processability and increased conductivity.

SUMMARY OF THE INVENTION

New compositions are provided comprising at least one conductive polymer and at least one non-polymeric fluorinated organic acid, wherein the conductive polymer is selected from a polythiophene, a polypyrrole, a polyaniline, and combinations thereof.

An electronic device is provided comprising at least one layer comprising a at least one new composition. Also provided is the use of the new composition in at least buffer of an electronic device The foregoing general description and the following detailed description are exemplary and explanatory only and are not restrictive of the invention, as defined in the appended claims.

BRIEF DESCRIPTION OF THE FIGURES

The invention is illustrated by way of example and not limited in the accompanying figures.

DETAILED DESCRIPTION OF THE INVENTION

Figure 1:
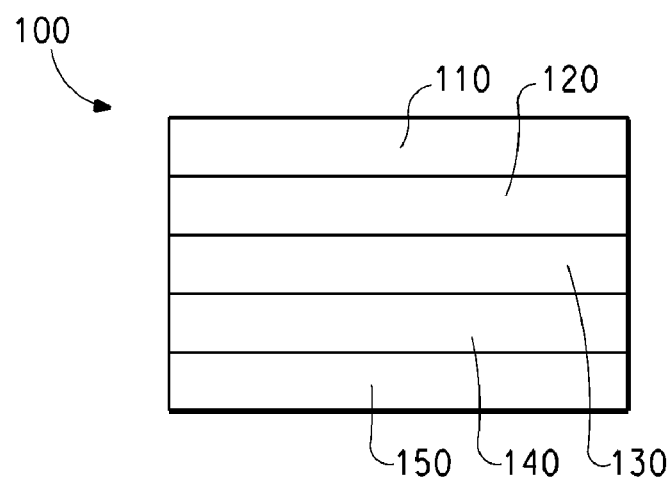
FIG. 1 illustrates a cross-sectional view of one type of an electronic device that comprises a buffer layer comprising the new composition.

In one embodiment, new compositions are provided comprising at least one conductive polymer and at least one non-polymeric fluorinated organic acid, wherein the conductive polymer is selected from a polythiophene, a polypyrrole, a polyaniline, and combinations thereof.

As used herein, the term "non-polymeric" is intended to mean a compound having a molecular weight no greater than about 2000. As used herein, the term "fluorinated organic acid" is intended to mean an organic compound having at least one acid group and at least one fluorine bonded to a carbon atom. The term encompasses partially fluorinated and perfluorinated materials.

The conductive polymers suitable for the new composition can be homopolymers, or they can be co-polymers of two or more respective monomers. The composition may comprise one or more different conductive polymers and one or more different non-polymeric fluorinated organic acids. In one embodiment, the conductive polymer is selected from a polythiophene, a polypyrrole, a polyaniline, and combinations thereof.

Polythiophenes contemplated for use in the new composition comprise Formula I below:

(I)

wherein:

$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and n is at least about 4.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

| | |
|---|---|
| "alcohol" | —$R^3$—OH |
| "amidosulfonate" | —$R^3$—C(O)N($R^6$)$R^4$—$SO_3$Z |
| "benzyl" | —$CH_2$—$C_6H_5$ |
| "carboxylate" | —$R^3$—C(O)O—Z |
| "ether" | —$R^3$—O—$R^5$ |
| "ether carboxylate" | —$R^3$—O—$R^4$—C(O)O—Z |
| "ether sulfonate" | —$R^3$—O—$R^4$—$SO_3$Z |
| "urethane" | —$R^3$—O—C(O)—N($R^6$)$_2$ | where all "R" groups are the same or different at each occurrence and:

$R^3$ is a single bond or an alkylene group
$R^4$ is an alkylene group
$R^5$ is an alkyl group
$R^6$ is hydrogen or an alkyl group
Z is H, alkali metal, alkaline earth metal, N($R^5$)$_4$ or $R^5$
Any of the above groups may further be unsubstituted or substituted, and any group may have F substituted for one or more hydrogens, including perfluorinated groups.

In one embodiment, in the polythiophene both $R^1$ together form —O—(CHY)$_m$—O—, where m is 2 or 3, and Y is the same or different at each occurrence and is selected from hydrogen, alkyl, alcohol, amidosulfonate, benzyl, carboxylate, ether, ether carboxylate, ether sulfonate, and urethane. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

Polypyrroles contemplated for use the new composition comprise Formula II below.

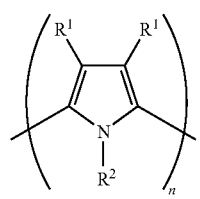

(II)

where in Formula II:
n is at least about 4;
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the polypyrrole is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—(CHY)$_m$—O —, where m is 2 or 3, and Y is the same or different at each occurrence and is selected from hydrogen, alkyl, alcohol, benzyl, carboxylate, amidosulfonate, ether, ether carboxylate, ether sulfonate, and urethane. In one embodiment, at least one Y group is not hydrogen. In one embodiment, at least one Y group is a substituent having F substituted for at least one hydrogen. In one embodiment, at least one Y group is perfluorinated.

Polyanilines contemplated for use in the new composition comprise Formula III or Formula IV below.

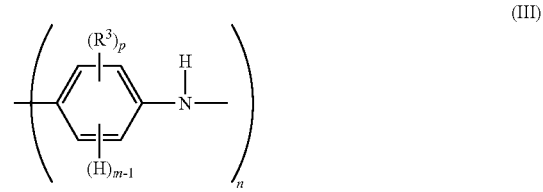

(III)

-continued

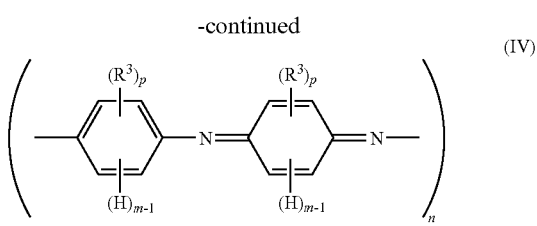
(IV)

wherein:
n is at least about 4;
p is an integer from 0 to 4;
m is an integer from 1 to 5, with the proviso that p+m=5; and
$R^3$ is independently selected so as to be the same or different at each occurrence and is selected from alkyl, alkenyl, alkoxy, cycloalkyl, cycloalkenyl, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^3$ groups together may form an alkylene or alkenylene chain completing a 3, 4, 5, 6, or 7-membered aromatic or alicyclic ring, which ring may optionally include one or more divalent nitrogen, sulfur or oxygen atoms.

In one embodiment, the polyaniline is unsubstituted and p=0.

The polythiophene and polypyrrole polymers formed by oxidative polymerization are positively charged. In the conductive form of polyaniline at least some of the nitrogens are protonated, so that it also is positively charged. The positive charges are balanced by negative ions used in the polymerization, usually acid anions.

Non-polymeric fluorinated organic acids contemplated for use in the new compositions can be soluble or dispersible in aqueous or non-aqueous liquid media. In one embodiment, the non-polymeric fluorinated organic acid is selected from non-polymeric fluorinated sulfonic acids, non-polymeric fluorinated phosphoric acids, non-polymeric fluorinated phosphonic acids, non-polymeric fluorinated carboxylic acids, non-polymeric fluorinated acrylic acids, and mixtures thereof. In one embodiment, the non-polymeric fluorinated organic acid is highly fluorinated. The term "highly fluorinated" is intended to mean that at least 50% of the hydrogens attached to carbon atoms have been replaced by fluorine. In one embodiment, the non-polymeric fluorinated organic acid is perfluorinated. In one embodiment, the non-polymeric fluorinated organic acid is a fluoroether organic acid, fluoroamido organic acid, or fluoroamidoether organic acid. In one embodiment, the non-polymeric fluorinated organic acid is perfluorinated.

As used herein, the following terms refer to the formulae given below:

| | |
|---|---|
| ether organic acid | $R^5$—O—$R^4$—Q |
| amido organic acid | $R^5$—C(O)N($R^6$)$R^4$—Q |
| amidoether organic acid | $R^5$—C(O)N($R^6$)$R^4$—O—$R^4$—Q | where $R^4$, $R^5$, and $R^6$ are as defined above, and Q is an acid group or an acid salt group. As used herein, the prefix "fluoro" is intended to mean that at least one hydrogen has been replaced by a fluorine. The term includes partially fluorinated and perfluorinated. In one embodiment, Q is selected from —$SO_3Z$, —$CO_2Z$, —$PO_3Z$, where Z is as defined above.

In one embodiment, the non-polymeric organic acid is a fluoroethersulfonic acid having Formula V:

$$R^7\text{—}(O\text{—}CF_2CFR_f)_a\text{—}O\text{—}CF_2CFR'_f SO_3H \quad (V)$$

wherein $R^7$ is a fluoroalkyl group, $R_f$ and $R'_f$ are independently selected from F, Cl or a perfluorinated alkyl group having 1 to 10 carbon atoms, and a=0, 1 or 2. In one embodiment, $R^7$ is a perfluorinated alkyl group. In one embodiment, $R^7$ is selected from difluoromethyl and 1,1,2,2-tetrafluoroethyl.

Examples of fluoroethersulfonic acids having Formula V include, but are not limited to 2-(1,1,2,3,3,3-hexafluoro-1-(perfluoroethoxy)propane-2-yloxy)-1,1,2,2-tetrafluoroethanesulfonic acid, 1,1,2,2-tetrafluoro-2-(perfluoroethoxy)ethanesulfonic acid, and 2-(1,1,2,2-tetrafluoroethoxy)-1,1,2,2-tetrafluoroethanesulfonic acid.

The fluoroethersulfonic acids can be made from the corresponding sulfonyl fluoride by hydrolyzing to form the sulfonic acid. The sulfonyl fluoride can be prepared according to known synthetic procedures. The acids can also converted to alkali metal salts.

In one embodiment, the new composition comprises an aqueous dispersion of a conductive polymer and a non-polymeric fluorinated organic acid. In one embodiment, the new composition comprises a non-aqueous dispersion of a conductive polymer and a non-polymeric fluorinated organic acid. As used herein, the term "dispersion" refers to a continuous liquid medium containing a suspension of minute particles. As used herein, the term "aqueous" refers to a liquid that has a significant portion of water, and in one embodiment it is at least about 40% by weight water.

The new compositions can be formed by adding together a conductive polymer and a non-polymeric fluorinated organic acid. The new compositions can also be formed by carrying out the polymerization reaction to form a conductive polymer in the presence of a non-polymeric fluorinated organic acid.

In one embodiment, the new composition is formed by combining a solution or dispersion of a conductive polymer with a solution or dispersion of a non-polymeric fluorinated organic acid. In one embodiment, the conductive polymer is in the form of an aqueous dispersion and the non-polymeric organic acid is in the form of an aqueous solution. In one embodiment, the materials are blended using sonication or microfluidization to ensure mixing of the components.

The synthesis of thiophene, pyrrole, and aniline polymers is well known and has been extensively described. Polymerization of thiophene monomers has been described in, for example, U.S. Pat. No. 5,300,575. Polymerization of aniline monomers has been described in, for example, U.S. Pat. No. 5,798,170.

In one embodiment, the conductive polymer is made by oxidative polymerization of the monomer or monomers to form the conductive polymer, in the presence of a soluble polymeric acid. The polymerization is generally carried out in a homogeneous solution. In one embodiment, the polymerization is carried out in a homogeneous aqueous solution. In another embodiment, the polymerization for obtaining the electrically conducting polymer is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the conductive polymer. The solution, dispersion, or emulsion of the conductive polymer will hereinafter be collectively referred to as the "liquid conductive polymer composition."

Aqueous dispersions of polypyrrole and a non-polymeric organic acid anion are available commercially from Sigma-Aldrich (St. Louis, Mo.). Aqueous dispersions of poly(2,3-ethylendioxythiophene)/PSSA are available commercially from H.C. Starck, GmbH. (Leverkusen, Germany). Aqueous and non-aqueous dispersions of doped polyaniline, and doped polyaniline solids are available commercially from Covion Organic Semiconductors GmbH (Frankfurt, Germany) or Ormecon (Ambersbek, Germany).

In one embodiment, the polymerization reaction to form the conductive polymer is carried out in the presence of the non-polymeric fluorinated organic acid. The polymerization can be carried out as described above. In one embodiment, the polymerization is carried out in the presence of the non-polymeric fluorinated organic acid and an additional polymeric acid. In one embodiment, the additional polymeric acid is a polymeric sulfonic acid. In one embodiment, the polymeric sulfonic acid is selected from polystyrene sulfonic acid ("PSSA") and poly(2-acrylamido-2-methyl-1-propane-sulfonic acid) ("PAAMPSA").

In one embodiment, the new composition is in the form of an aqueous dispersion and further comprises a co-dispersing liquid. As used herein, the term "co-dispersing liquid" refers to a substance which is liquid at room temperature and is miscible with water. As used herein, the term "miscible" means that the co-dispersing liquid is capable of being mixed with water (at concentrations set forth herein for each particular co-dispersing liquid) to form a substantially homogeneous solution.

Co-dispersing liquids contemplated for use in the new composition are generally polar, water-miscible organic liquids. Examples of suitable types of co-dispersing liquids include, but are not limited to, ethers, cyclic ethers, alcohols, alcohol ethers, ketones, nitriles, sulfides, sulfoxides, amides, amines, carboxylic acids, and the like, as well as combinations of any two or more thereof.

In one embodiment, the co-dispersing liquid comprises a liquid selected from, n-propanol, isopropanol, methanol, butanol, 1-methoxy-2-propanol, dimethylacetamide, n-methyl pryrozole, 1,4-dioxane, tetrahydrofuran, tetrahydropyran, 4 methyl-1,3-dioxane, 4-phenyl-1,3-dioxane, 1,3-dioxolane, 2-methyl-1,3-dioxolane, 1,3-dioxane, 2,5-dimethoxytetrahydrofuran, 2,5-dimethoxy-2,5-dihydrofuran, 1-methylpyrrolindine, 1-methyl-2-pyrrolidinone, dimethylsulfoxide, and combinations of any two or more thereof.

In one embodiment, compositions are provided comprising non-aqueous dispersions of at least one conductive polymer and at least one non-polymeric fluorinated organic acid. In one embodiment, the non-aqueous composition is made by dispersing conductive polymer solids and non-polymeric fluorinated organic acid solids in a non-aqueous liquid medium. In one embodiment, the non-aqueous composition is made by dispersing non-polymeric fluorinated organic acid solids in a non-aqueous solution or a non-aqueous dispersion of conductive polymer. In one embodiment, the non-aqueous composition is made by dispersing conductive polymer solids in a non-aqueous dispersion or a non-aqueous solution of non-polymeric fluorinated organic acid. In one embodiment, the non-aqueous composition is made by combining a non-aqueous solution or dispersion of conductive polymer with a non-aqueous solutions or dispersion of non-polymeric fluorinated organic acid. The two non-aqueous media can be the same or different, as long as they are miscible with each other in the desired proportions. In any of the above embodiments, the materials can be blended using sonication or microfluidization to ensure adequate mixing of the components.

Dispersions of electrically conductive polymers generally have a fairly low pH due to the presence of acids in the oxidative polymerization process. For example, aqueous poly (ethylenedioxythiophene) ("PEDT") dispersions, Baytron®-P VP AI 4083 and CH8000, from H. C. Starck, GmbH, Leverkusen, Germany have a pH below 2. It is frequently desirable to have aqueous dispersions of conductive polymers with a higher pH, as the acidity can be corrosive. With Baytron-P, adjusting the pH to higher levels can have a deleterious effect on the electrical properties of the conductive polymer and their functional effectiveness as a buffer layer in OLEDs.

In new compositions comprising at least one electrically conducting polymer and at least one non-polymeric fluorinated acid, it has been found that the pH can be adjusted without sacrificing electrical properties. The pH can be adjusted using known techniques, for example, ion exchange, by titration with an aqueous basic solution, or addition of a solid alkali metal hydroxide or alkaline earth hydroxide. The new compositions can have a pH adjusted from 1 to 8. Adjusting the pH to higher, more neutral values, does not deleteriously affect the electrical properties and device performance of the conductive polymers in the new composition, and in most cases improves those properties.

In one embodiment, the liquid conductive polymer composition is contacted with at least one ion exchange resin under conditions suitable to remove decomposed species, side reaction products, unreacted monomers, and ionic impurities, and to adjust pH. This can be carried out at any point after the polymerization reaction to form the conductive polymer. Thus the treatment can be carried out on the as-synthesized conductive polymer, the conductive polymer after it is combined with the non-polymeric fluorinated organic acid, the conductive polymer after it is redispersed in a non-aqueous liquid medium without the non-polymeric fluorinated organic acid, and the conductive polymer after it is redispersed in a non-aqueous liquid medium with the non-polymeric fluorinated organic acid. The liquid conductive polymer composition can be contacted with at least one ion exchange resin before or after the addition of a co-dispersing liquid. In one embodiment, the liquid conductive polymer composition is contacted with a first ion exchange resin and a second ion exchange resin.

In another embodiment, the first ion exchange resin is an acidic, cation exchange resin, such as a sulfonic acid cation exchange resin set forth above, and the second ion exchange resin is a basic, anion exchange resin, such as a tertiary amine or a quaternary exchange resin.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins are contemplated for use in the new process.

In one embodiment, the acidic, cation exchange resin is an organic acid, cation exchange resin, such as a sulfonic acid cation exchange resin. Sulfonic acid cation exchange resins contemplated for use in the new process include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphoric acid cation exchange resin. In addition, mixtures of different cation exchange resins can be used. In many cases, the basic ion exchange resin can be used to adjust the pH to the desired level. In some cases, the pH can be further adjusted with an aqueous basic solution such as a solution of sodium hydroxide, ammonium hydroxide, or the like.

In another embodiment, the basic, anionic exchange resin is a tertiary amine anion exchange resin. Tertiary amine anion exchange resins contemplated for use in the new compositions include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the liquid conductive polymer composition either simultaneously, or consecutively. For example, in one embodiment both resins are added simultaneously to a liquid conductive polymer composition, and allowed to remain in contact with the dispersion for at least about 1 hour, e.g., about 2 hours to about 20 hours. The ion exchange resins can then be removed from the composition by filtration. The size of the filter is chosen so that the relatively large ion exchange resin particles will be removed while the solution and smaller dispersion particles will pass through. The basic, anion exchange and/or acidic, cation exchange resins renders the acidic sites more basic, resulting in increased pH of the dispersion. In general, at least 1 gram of ion exchange is used per about 1 gram of composition solids. In other embodiments, the use of the ion exchange resin is used in a ratio of up to about 5 grams of ion exchange resin to composition solids, and depends on the pH that is to be achieved. In one embodiment, about one gram of Lewatit® MP62 WS, a weakly basic anion exchange resin from Bayer GmbH, and about one gram of Lewatit® MonoPlus S100, a strongly acidic, sodium cation exchange resin from Bayer, GmbH, are used per gram of the new composition.

In another embodiment, more conductive dispersions are formed by the addition of highly conductive additives to the new composition comprising at least one conductive polymer and at least one non-polymeric fluorinated organic acid. In one embodiment, new compositions with relatively high pH can be formed, and further comprise the conductive additives, especially metal additives, which are not attacked by the acid in the dispersion.

In one embodiment, the new composition further comprises at least one conductive additive at a weight percentage sufficient to reach the percolation threshold. Examples of suitable conductive additives include, but are not limited to conductive polymers, metal particles and nanoparticles, metal nanowires, carbon nanotubes, carbon nanoparticles, graphite fibers or particles, carbon particles, and combinations thereof. A dispersing agent may be included to facilitate dispersing of the conductive additives.

In one embodiment, the new compositions are deposited to form electrically conductive or semiconductive layers which are used alone, or in combination with other electroactive materials, as electrodes, electroactive elements, photoactive elements, or bioactive elements. As used herein, the terms "electroactive element", "photoactive element" and "bioactive element" refer to elements which exhibit the named activity in response to a stimulus, such as an electromagnetic field, an electrical potential, solar energy radiation, and a biostimulation field.

In one embodiment, the new compositions are deposited to form buffer layers in an electronic device. The term "buffer layer" as used herein, is intended to mean an electrically conductive or semiconductive layer which can be used between an anode and an active organic material. A buffer layer is believed to accomplish one or more function in an organic electronic device, including, but not limited to planarization of the underlying layer, hole transport, hole injection, scavenging of impurities, such as oxygen and metal ions, among other aspects to facilitate or to improve the performance of an organic electronic device.

The term "layer" or "film" refers to a coating covering a desired area. The area can be as large as an entire device or as small as a specific functional area such as the actual visual display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

In one embodiment, there are provided buffer layers deposited from liquid compositions comprising at least one conductive polymer and at least one non-polymeric fluorinated organic acid. In one embodiment, the buffer layers are deposited from aqueous dispersions comprising at least one conductive polymer and at least one non-polymeric fluorinated organic sulfonic acid. In another embodiment, the buffer layers are deposited from aqueous dispersion comprising at least one conductive polymer and at least one non-polymeric fluorinated organic acid, wherein the conductive polymer is selected from poly(3,4-ethylenedioxythiophene), unsubstituted polypyrrole, and unsubstituted polyaniline.

In another embodiment, there are provided buffer layers deposited from liquid compositions comprising at least one conductive polymer and at least one non-polymeric fluorinated organic acid, which further comprise at least one co-dispersing liquid. In one embodiment, the co-dispersing liquid is selected from n-propanol, isopropanol, t-butanol, methanol dimethylacetamide, dimethylformamide, N-methylpyrrolidone, ethylene glycol, and mixtures thereof.

In another embodiment, there are provided buffer layers deposited from aqueous dispersions comprising at least one conductive polymer and at least one non-polymeric fluorinated organic acid, which dispersion is further blended with other water soluble or dispersible materials. Depending on the final application of the material, examples of types of additional water soluble or dispersible materials which can be added include, but are not limited to polymers, dyes, coating aids, carbon nanotubes, metal nanowires and nanoparticles, organic and inorganic conductive inks and pastes, charge transport materials, piezoelectric, pyroelectric, or ferroelectric oxide nano-particles or polymers, photoconductive oxide nanoparticles or polymers, dispersing agents, crosslinking agents, and combinations thereof. The materials can be simple molecules or polymers. Examples of suitable other water soluble or dispersible polymers include, but are not limited to, polyacrylamide, polyvinylalcohol, poly(2-vinylpridine), poly(vinylacetate), poly(vinylmethylether), poly(vinylpyrrolidone), poly(vinylbutyral), poly(styrenesulfonic acid, and conductive polymers such as polythiophenes, polyanilines, polyamines, polypyrroles, polyacetylenes, and combinations thereof.

In another embodiment, there are provided electronic devices comprising at least one electrically conductive or semiconductive layer comprising the new composition. Organic electronic devices that may benefit from having one or more layers made from the new composition include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the new compositions include coating materials for memory storage devices, antistatic films, biosensors, electrochromic devices, solid electrolyte capacitors, energy storage devices such as a rechargeable battery, and electromagnetic shielding applications.

In one embodiment, the organic electronic device comprises an electroactive layer positioned between two electrical contact layers, wherein at least one of the layers of the device includes the new buffer layer. One embodiment is illustrated in one type of OLED device, as shown in FIG. 1, which is a device that has anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole. The IUPAC number system is used throughout, where the groups from the Periodic Table are numbered from left to right as 1-18 (CRC Handbook of Chemistry and Physics, 81$^{st}$ Edition, 2000).

The anode layer 110 may be formed by a chemical or physical vapor deposition process or spin-coating process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 can be deposited onto substrates using any technique well-known to those skilled in the art.

The electroluminescent (EL) layer 130 may typically be any organic EL material, including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

The particular material chosen may depend on the specific application, potentials used during operation, or other factors. The EL layer 130 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., Alq$_3$ or the like); phenanthroline-based compounds (e.g., 2,9-dimethyl-4,7-diphenyl- 1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. In one embodiment, inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 100 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

In organic light emitting diodes (OLEDs), electrons and holes, injected from the cathode 150 and anode 110 layers, respectively, into the EL layer 130, form negative and positively charged polar ions in the polymer. These polar ions migrate under the influence of the applied electric field, forming a polar ion exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

In one embodiment, OLEDs comprising at least one buffer layer deposited from the new composition have been found to have improved lifetimes. In one embodiment the buffer layer is deposited using any solution processing technique and is an aqueous dispersion in which the pH has been adjusted to above about 2.0.

In one embodiment a pH neutral composition is used in at least one layer of an electronic device. In one OLED embodiment, the pH is adjusted so as to reduce etching of the ITO layer during device fabrication and hence much lower concentration of In and Sn ions diffusing into the polymer layers of the OLED. Since In and Sn ions are suspected to contribute to reduced operating lifetime this is a significant benefit. The lower acidity also reduces corrosion of the metal components of the display (e.g. electrical contact pads) during fabrication and over the long-term storage. PEDT/PSSA residues will interact with residual moisture to release acid into the displays with resulting slow corrosion.

The layer in an organic electronic device comprising the new composition may further be overcoated with a layer of conductive polymer applied from a non-aqueous medium. The conductive polymer can facilitate charge transfer and also improve coatability. Examples of suitable conductive polymers include, but are not limited to, polyanilines, polythiophenes, polydioxythiophene/polystyrenesulfonic acid, polyaniline/polymeric-acid-colloids such as those disclosed in co-pending application Ser. No. 10/669,577, polythiophene/polymeric-acid-colloids such as those disclosed in co-pending application Ser. No. 10/669,494, polypyrroles, polyacetylenes, and combinations thereof. The composition comprising such a layer may further comprise conductive polymers, and may also comprise dyes, carbon nanotubes, carbon nanoparticles, metal nanowires, metal nanoparticles, carbon fibers and particles, graphite fibers and particles, coating aids, organic and inorganic conductive inks and pastes, charge transport materials, semiconductive or insulating inorganic oxide particles, piezoelectric, pyroelectric, or ferroelectric oxide nano-particles or polymers, photoconductive oxide nanoparticles or polymers, dispersing agents, crosslinking agents and combinations thereof. These materials can be added to the new composition either before or after polymerization of the monomer and/or before or after treatment with at least one ion exchange resin.

In one embodiment, there are provided thin film field effect transistors comprising electrodes made from the new composition. For use as electrodes in thin film field effect transistors, the conducting polymers and the liquids for dispersing or dissolving the conducting polymers must be compatible with the semiconducting polymers and the solvents for the semiconducting polymers to avoid re-dissolution of either conducting polymers or semiconducting polymers. Thin film field effect transistor electrodes fabricated from conducting polymers should have a conductivity greater than 10 S/cm. However, electrically conducting polymers doped with non-polymeric organic acid anions only provide conductivity in the range of 10 S/cm or lower. Thus, in one embodiment, the electrodes comprise a conductive polymer selected from polythiophenes, polypyrroles, and polyanilines doped with at least one non-polymeric organic acid anion, and a fluorinated colloid-forming polymeric sulfonic acid in combination with electrical conductivity enhancers such as metal nanowires, metal nanoparticles, carbon nanotubes, or the like. The new compositions may be used in thin film field effect transistors as gate electrodes, drain electrodes, or source electrodes.

Figure 2:
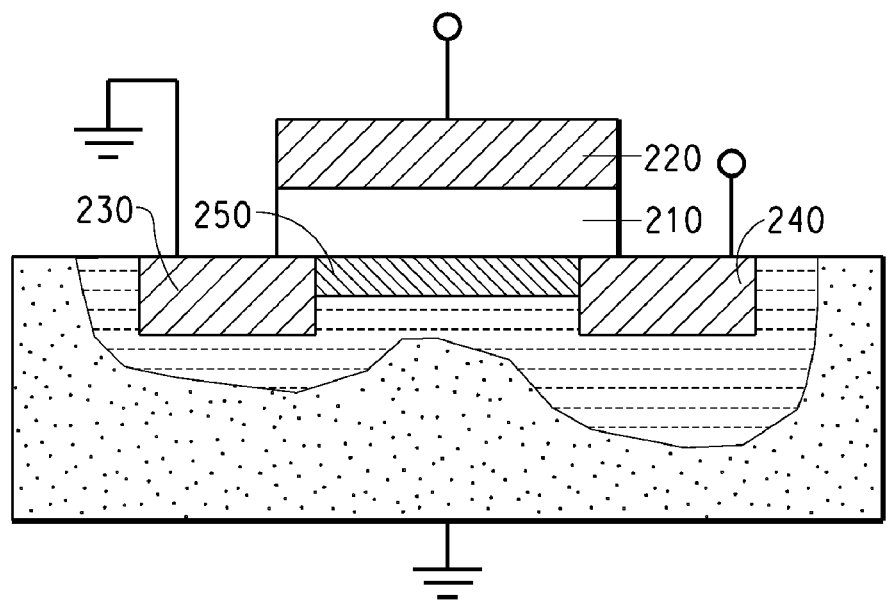
FIG. 2 illustrates a cross-sectional view of a thin film field effect transistor that comprises an electrode comprising the new composition.

Another illustration of a use for the new composition, is the thin film field effect transistors, is shown in FIG. 2. In this illustration, a dielectric polymer or dielectric oxide thin film 210 has a gate electrode 220 on one side and drain and source electrodes, 230 and 240, respectively, on the other side. Between the drain and source electrode, an organic semiconducting film 250 is deposited. New aqueous dispersions containing nanowires or carbon nanotubes are ideal for the applications of gate, drain and source electrodes because of their compatibility with organic based dielectric polymers and semiconducting polymers in solution thin film deposition. Since new compositions as a colloidal dispersion, less weight percentage of the conductive fillers is required (relative to compositions containing water soluble polymeric sulfonic acids) to reach percolation threshold for a desired or high electrical conductivity.

In another embodiment, there are provided field effect resistance devices comprising one layer comprising the new composition. The field effect resistance devices undergo reversible change of resistance in the conducting polymer films when subjected to a pulse of gate voltage as illustrated in pages 339-343, No. 2, 2002, Current Applied Physics.

In another embodiment, there are provided electrochromic displays comprising at least one layer comprising the new composition. Electrochromic displays utilize change of color when thin film of the material is subjected to electrical potential.

In yet another embodiment, there are provided memory storage devices comprising silicon chips top-coated with the new composition. For example, a write-once-read-many-times (WORM) memory is known in the arts (Nature, Page 166 to 169, vol 426, 2003). When information is recorded, higher voltages at certain points in the circuit grids of silicon chips destroys the conductive polymer at those points to create "zero" bit data. The conductive polymer at the untouched points remains electrically conductive and becomes "1" bit data.

In another embodiment, the new compositions are used to form coatings for biosensor or electromagnetic shielding applications.

In another embodiment, the new compositions can be used for antistatic coatings for plastic and cathode ray tubes, electrode materials for solid electrolyte capacitors, metal anti-corrosion coatings, through-hole plating of printed circuit boards, photodiodes, bio-sensors, photodetectors, rechargeable batteries, photovoltaic devices, and photodiodes. In addition, examples of other applications for the new compositions can be found in, for example, Advanced Materials, page 490 to 491, vol. 12, No. 7, 2000.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The new compositions and their uses will now be described in greater detail by reference to the following non-limiting examples.

EXAMPLES

Example 1

This example will illustrate preparation of three non-polymeric fluoroethersulfonic acids, and their alkali metal salts:

The sulfonyl fluoride form of the following three fluoroethersulfonic acids will be made first according to designed synthetic procedures. Each of the sulfonyl fluorides will be hydrolyzed to form the sulfonic acid. The acids will be also converted to alkali metal salts depending on their use in the following examples.

1) 2-(1,1,2,3,3,3-hexafluoro-1-(perfluoroethoxy)propane-2-yloxy)-1,1,2,2-tetrafluoroethanesulfonic acid:

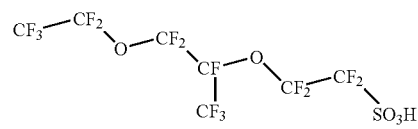

2) 1,1,2,2-tetrafluoro-2-(perfluoroethoxy)ethanesulfonic acid:

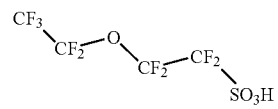

3) 2-(1,1,2,2-tetrafluoroethoxy)-1,1,2,2-tetrafluoroethanesulfonic acid:

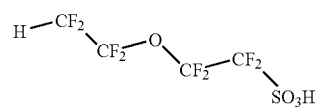

Example 2

This Example will illustrate the polymerization of 3,4-ethylenedioxythiophene in the presence of 2-[1,1,2,3,3,3-hexafluoro-1-(perfluoroethoxy)propane-2-yloxy)-1,1,2,2-tetrafluoroethanesulfonic acid, and polystyrenesulfonic acid, and organic light emitting diodes made therewith.

12.52 g (25.97 mmoles) perfluorosulfonic acid, 660.57 g deionized water will be massed into a one liter jacketed three-necked round bottom flask. 15.95 g 30% polystyrenesulfonic acid solution (70,000 molecular weight from PolySciences, Inc.) will be added to the reactor as a co-acid. The mixture will be allowed to stir for 20° C. for 30 minutes. 2.768 ml (25.973 mmoles) of Baytron-M (a trade name for 3,4-ethylenedioxythiophene from H.C. Starck, MA, USA) will be added to the mixture and allowed to stir for 15 more minutes before addition of ferric sulfate and sodium persulfate. 7.55 g (31.709 mmoles) sodium persulfate will be first dissolved in 10 g deionized water in a glass vial and then transferred to the ration mixture while the mixture is being stirred. A stock solution of ferric sulfate will be made first by dissolving 0.0942 g ferric sulfate hydrate with deionized water to a total weight of 20.8617 g. 7.30 g (0.0637 mmoles) of the ferric sulfate stock solution will be added to the reaction flask immediately after the addition of the sodium persulfate solution. The polymerization will be allowed to proceed with stirring at about 20° C. controlled by circulation fluid. The reaction will be terminated in about 12 hours by adding Lewatit® S100, a trade name from Bayer, Pittsburgh, Pa., for sodium sulfonate of crosslinked polystyrene, and Lewatit® MP62 WS, a trade from Bayer, Pittsburgh, Pa., for free base/chloride of tertiary/quaternary amine of crosslinked polystyrene. The two resins will be washed first before use with deionized water separately until there is no color in the water. The resin treatment will proceed for at least 4 hrs. The resulting slurry will then be suction-filtered through a Buchner Funnel containing two pieces of Whatman #4 filter paper. pH and conductivity of the dispersion will be determined.

The aqueous dispersion will be spin-coated onto an ITO substrate, and sequentially spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime.

A second sample of the dispersion will be further treated with ion exchange resins or titrated with a basic aqueous solution to adjust the pH to a higher value for device fabrication and testing.

Example 3

This example will illustrate the blending of 2-(1,1,2,3,3,3-hexafluoro-1-(perfluoroethoxy)propane-2-yloxy)-1,1,2,2-tetrafluoroethanesulfonic acid with Baytron-P®, AI4083, by sonication, and additional treatment for achieving higher pH, and organic light emitting diodes made therewith.

In this example, Baytron-P® AI4083 (solid: ~2.6%; pH~1.67) will be used to form a blend with the perfluorosulfonic acid. AI4083 is an aqueous PEDT/PSSA dispersion from H. C. Starck, GmbH, Leverkusen, Germany. The w/w ratio between PEDT/PSSA is 1:6. 1.227 g perfluorosulfonic acid will be added to 96.84 g Baytron-P in a 250 mL round bottom flask while being stirred with a magnetic stirrer. Resulting dispersion will contain ~3.8% solid in which the equivalent ratio between perfluorosulfonic acid/PEDT/PSSA will be 1.0/1.0/4.6. The "equivalent ratio" as used herein is intended to mean the ratio of the number of acid equivalents of the perfluorosulfonic acid to the number of monomer units of PEDT and/or polymeric acid anion. The entire dispersion will then be subjected to sonication. The dispersion will then be checked for particle size using an AccuSizer Model 780A (Particle Sizing Systems, Santa Barbara, Calif.).

The aqueous dispersion will be spin-coated onto an ITO substrate, and sequentially spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime.

A second sample of the dispersion will be further treated with ion exchange resins or titrated with a basic aqueous solution for achieving higher pH for device fabrication and testing.

Example 4

This example will illustrate the blending of 1,1,2,2-tetrafluoro-2-(perfluoroethoxy)ethanesulfonic acid with Baytron-P®, AI4083, by sonication, and additional treatment for achieving higher pH, and organic light emitting diodes made therewith.

In this example, Baytron-P® AI4083 (solid: ~2.6%; pH~1.67) will be used to form a blend with the perfluorosulfonic acid. AI4083 is an aqueous PEDT/PSSA dispersion from H. C. Starck, GmbH, Leverkusen, Germany. The w/w ratio between PEDT/PSSA is 1:6. 0.804 g perfluorosulfonic acid will be added to 96.84 g Baytron-P® in a 250 mL round bottom flask while being stirred with a magnetic stirrer. Resulting dispersion will contain 3.40% solid in which the equivalent ratio between perfluorosulfonic acid/PEDT/PSSA will be 1.0/1.0/4.6. The "equivalent ratio" as used herein is intended to mean the ratio of the number of acid equivalents of the perfluorosulfonic acid to the number of monomer units of PEDT and/or polymeric acid anion. The entire dispersion will then be subjected to sonication. The dispersion will then be checked for particle size using an AccuSizer Model 780A (Particle Sizing Systems, Santa Barbara, Calif.).

The aqueous dispersion will be spin-coated onto an ITO substrate, and sequentially spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime.

A second sample of the dispersion will be further treated with ion exchange resins or titrated with a basic aqueous solution to adjust the pH to a higher value for device fabrication and testing.

Example 5

This example will illustrate blending of 2-[1,1,2,3,3,3-hexafluoro-1-(perfluoroethoxy)propane-2-yloxy)-1,1,2,2-tetrafluoroethanesulfonic acid with an aqueous PAni dispersion from Ormecon (Ambersbek, Germany), sold by Covion (Frankfurt, Germany), and additional treatment for achieving higher pH, and organic light emitting diodes made therewith.

D1002W PAni from Ormecon is an electrically conducting polyaniline/PSSA ("doped-PAni") dispersed in water. A selected amount of the perfluorosulfonica acid will be added to a known amount of D1002W dispersion. The aqueous dispersion of doped-PAni/perfluorosulfonic acid will be spin-coated onto an ITO substrate, and sequentially spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with as-is D1000W PAni.

A second sample of the dispersion of PAni/perfluorosulfonic acid will be adjusted to a higher pH for device fabrication and testing.

Example 6

This example will illustrate the blending of 2-(1,1,2,3,3,3-hexafluoro-1-(perfluoroethoxy)propane-2-yloxy)-1,1,2,2-tetrafluoroethanesulfonic acid with a commercial aqueous polypyrrole dispersion and additional treatment for achieving higher pH and organic light emitting diodes made therewith.

A commercial aqueous polypyrrole composition (5%, w/w) from Aldrich (2003-2004 Cat # 48,255-2) is a conductive polypyrrole doped with an organic acid ("doped-PPy"). This will be diluted with deionized water down to 2.5% w/w. The dilution will be necessary to obtain a viscosity, which will allow the use of reasonable spin rates (<5,000 RPM). A selected amount of the perfluorosulfonic acid will be added to a known amount of the diluted doped-PPy dispersion. The doped-PPy/perfluorosulfonic acid dispersion will be spin-coated onto an ITO substrate. The dried layer will be sequentially spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime.

A second sample of the dispersion of doped-PPy/perfluorosulfonic acid will be adjusted to a higher pH for device fabrication and testing.

Example 7

This example will illustrate blending of 2-(1,1,2,3,3,3-hexafluoro-1-(perfluoroethoxy)propane-2-yloxy)-1,1,2,2-tetrafluoroethanesulfonic acid with a non-aqueous PEDT/PSSA dispersion, and organic light emitting diodes made therewith:

An aqueous PEDT/PSSA dispersion will be prepared first before reformulation to a non-aqueous PEDT/PSSA dispersion. The aqueous PEDT/PSSA dispersion will be made according to a procedure similar to the procedure in Example 2 except without use of the perfluorosulfonic acid. As-prepared aqueous PEDT/PSSA dispersion will be isolated and kept partially wet before re-dispersion with n-propanol, DMAc, or NMP. The re-formulated non-aqueous PEDT/PSSA, ("doped-PEDT") will be added with a selected amount of the perfluorosulfonic acid. The non-aqueous doped-PEDT/perfluorosulfonic acid dispersion will be spin-coated onto an ITO substrate, and sequentially spin-coated with either light-emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime.

A second sample of the dispersion of will be treated for achieving higher pH for device fabrication and testing.

What is claimed is:

1. A composition comprising at least one doped conductive polymer and at least one non-polymeric fluorinated organic acid, salt or ester, wherein the conductive polymer is selected from the group consisting of a polythiophene, a polypyrrole, a polyaniline, and combinations thereof, wherein said non-polymeric fluorinated organic acid, salt or ester comprises at least one fluoroether organic acid, salt or ester having the following general formula, $$R^5-O-R^4-Q,$$

wherein $R^4$ is an alkylene group, $R^5$ is an alkyl group, and are the same or different at each occurrence, Q is selected from $-SO_3Z$, $-CO_2Z$, and $-PO_3Z$, Z is H, alkali metal, alkaline earth metal, $N(R^5)_4$, or $R^5$, any of $R^4$ and $R^5$ may, independently, be unsubstituted or substituted, and the prefix "fluoro" means that at least one hydrogen of $R^4$ or $R^5$ has been replaced by fluorine, and includes partially fluorinated and perfluorinated.

2. A composition according to claim 1, wherein the composition is an aqueous dispersion having a pH 1 and 8.

3. A composition according to claim 2, further comprising an additional material selected from the group consisting of polymers, dyes, carbon nanotubes, metal nanowires, metal nanoparticles, carbon nanoparticles, carbon fibers, carbon particles, graphite fibers, graphite particles, coating aids, organic conductive inks, organic conductive pastes, inorganic conductive inks, inorganic conductive pastes, charge transport materials, semiconductive inorganic oxide nano-particles, insulating inorganic oxide nano-particles, piezoelectric nano-particles, pyroelectric nano-particles, ferroelectric oxide nano-particles, piezoelectric polymers, pyroelectric polymers, ferroelectric oxide polymers, photoconductive oxide nanoparticles, photoconductive polymers, dispersing agents, crosslinking agents, and combinations thereof.

4. A composition according to claim 2, further comprising at least one co-dispersing liquid.

5. A composition according to claim 4, wherein the co-dispersing liquid is selected from the group consisting of ethers, cyclic ethers, alcohols, alcohol ethers, ketones, nitriles, sulfides, sulfoxides, amides, amines, carboxylic acids, and combinations thereof.

6. A composition according to claim 1, wherein the polythiophene comprises Formula I:

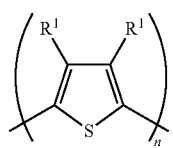

(I)

wherein:

$R^1$ is independently selected so as to be the same or different at each occurrence and is selected from the group consisting of hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and
n is at least about 4.

7. A composition according to claim 1, wherein the polypyrrole comprises Formula II:

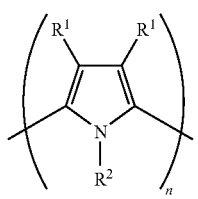

(II)

wherein:
n is at least about 4;
$R^1$ is independently selected so as to be the same or different at each occurrence and is selected from the group consisting of hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and
$R^2$ is independently selected so as to be the same or different at each occurrence and is selected from the group consisting of hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, amidosulfonate, ether sulfonate, and urethane.

8. A composition according to claim 1, wherein the polyaniline comprises Formula III or Formula IV:

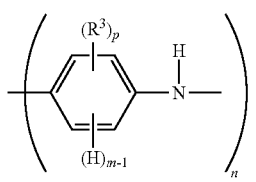

(III)

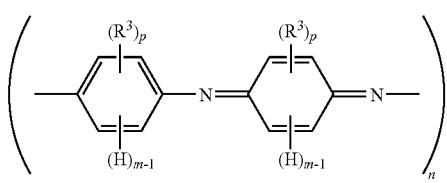

(IV)

wherein:
n is at least about 4;
p is an integer from 0 to 4;
m is an integer from 1 to 5, with the proviso that p+m=5; and $R^3$ is independently selected so as to be the same or different at each occurrence and is selected from the group consisting of alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^3$ groups together may form an alkylene or alkenylene chain completing a 3, 4, 5, 6, or 7-membered aromatic or alicyclic ring, which ring may optionally include one or more divalent nitrogen, sulfur or oxygen atoms.

9. A composition according to claim 1, wherein said non-polymeric fluorinated organic acid is highly fluorinated.

10. A composition according to claim 9, wherein said non-polymeric organic acid is perfluorinated.

11. An electronic device comprising at least one layer comprising a composition according to claim 1.

12. A device according to claim 11, wherein the layer is a buffer layer.

13. A device according to claim 11, wherein the device is selected from the group consisting of photosensor, photoswitch, light-emitting diode, light-emitting diode display, photodetector, phototransistor, photoconductor, phototube, Infra-Red detector, diode laser, electrochromic device, electromagnetic shielding device, solid electrolyte capacitors, energy storage device, field effect resistance device, memory storage device, biosensor, photoconductive cell, photovoltaic device, solar cell, memory storage, antistatic film, electrochromic, solid electrolyte capacitors, energy storage, electromagnetic shield and diode.

14. A thin film field effect transistor comprising at least one electrode comprising the composition of claim 1.

15. A composition comprising at least one doped conductive polymer and at least one non-polymeric fluorinated organic acid, wherein the conductive polymer is selected from the group consisting of a polythiophene, a polypyrrole, a polyaniline, and combinations thereof; and wherein said non-polymeric fluorinated organic acid is a fluoroether sulfonic acid having Formula V:

$$R^7-(O-CF_2CFR_f)_a-O-CF_2CFR'_f SO_3H \quad (V)$$

wherein $R^7$ is a fluoroalkyl group, Rf and R'f are independently selected from F, Cl or a perfluorinated alkyl group having 1 to 10 carbon atoms, and a=0, 1 or 2.

16. A composition according to claim 15, wherein said fluoroethersulfonic acid is selected from the group consisting of 2-(1,1,2,3,3,3-hexafluoro-1-(perfluoroethoxy)propane-2-yloxy)-1,1,2,2-tetrafluoroethanesulfonic acid, 1,1,2,2-tetrafluoro-2(perfluoroethoxy)ethanesulfonic acid, and 2-(1,1,2,2-tetrafluoroethoxy)-1,1,2,2-tetrafluoroethanesulfonic acid.

17. An electronic device comprising at least one layer comprising a composition according to claim 16.

18. A device according to claim 17, wherein the layer is a buffer layer.

19. An electronic device comprising at least one layer comprising a composition according to claim 15.

20. A device according to claim 19, wherein the layer is a buffer layer.

* * * * *